US009196354B2

(12) United States Patent
Strachan et al.

(10) Patent No.: US 9,196,354 B2
(45) Date of Patent: Nov. 24, 2015

(54) MEMORY RESISTOR ADJUSTMENT USING FEEDBACK CONTROL

(75) Inventors: John Paul Strachan, Millbrae, CA (US); Julien Borghetti, Mountain View, CA (US); Matthew D. Pickett, San Francisco, CA (US); Gilberto Ribeiro, Menlo Park, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 389 days.

(21) Appl. No.: 13/387,307

(22) PCT Filed: Feb. 9, 2010

(86) PCT No.: PCT/US2010/023550
§ 371 (c)(1),
(2), (4) Date: Jan. 26, 2012

(87) PCT Pub. No.: WO2011/099961
PCT Pub. Date: Aug. 18, 2011

(65) Prior Publication Data
US 2012/0127780 A1    May 24, 2012

(51) Int. Cl.
G11C 11/56 (2006.01)
G11C 13/00 (2006.01)
G11C 11/54 (2006.01)

(52) U.S. Cl.
CPC ........ *G11C 11/5678* (2013.01); *G11C 13/0007* (2013.01); *G11C 13/0069* (2013.01); *G11C 11/54* (2013.01); *G11C 2013/0092* (2013.01)

(58) Field of Classification Search
CPC .......... G11C 13/0069; G11C 13/0004; G11C 13/0007; H03H 11/245; H03H 11/24; H03K 17/693; G06G 7/18; G06G 7/28; G06G 7/25; G06G 7/26; G01F 1/58
USPC .............................................. 365/148; 706/25
See application file for complete search history.

(56) References Cited

U.S. PATENT DOCUMENTS

| 3,614,633 | A | * | 10/1971 | Yalyshev et al. | 327/345 |
| 4,530,044 | A | * | 7/1985 | Milner | 323/365 |
| 7,106,120 | B1 | * | 9/2006 | Hsu | 327/308 |
| 7,902,867 | B2 | * | 3/2011 | Mouttet | 326/41 |
| 2005/0127403 | A1 | | 6/2005 | Hsu | |
| 2006/0254124 | A1 | * | 11/2006 | DeYoreo et al. | 43/139 |
| 2007/0109835 | A1 | | 5/2007 | Shu | |
| 2008/0308783 | A1 | | 12/2008 | Ahn | |
| 2009/0163826 | A1 | * | 6/2009 | Mouttet | 600/544 |

* cited by examiner

*Primary Examiner* — Richard Elms
*Assistant Examiner* — Ajay Ojha
(74) *Attorney, Agent, or Firm* — Hewlett-Packard Patent Department

(57) ABSTRACT

Apparatus and methods related to memory resistors are provided. A feedback controller applies adjustment signals to a memristor. A non-volatile electrical resistance of the memristor is sensed by the feedback controller during the adjustment. The memristor is adjusted to particular values lying between first and second limiting values with minimal overshoot. Increased memristor service life, faster operation, lower power consumption, and higher operational integrity are achieved by the present teachings.

20 Claims, 3 Drawing Sheets

MEMORY RESISTOR ADJUSTMENT USING FEEDBACK CONTROL

BACKGROUND

Memory resistors or "memristors" are electronic constructs that exhibit an adjustable, non-volatile electrical resistance characterized by a minimum (on, or "low state") and a maximum (off or "high state") resistance value. Known circuits and applications operate their memristors at these respective minimum and maximum resistance values, switching between limiting values as needed. These low and high resistance states are typically separated by one-thousand to ten-thousands Ohms.

However, it has been discovered that memristors may exhibit undesirably short useful life spans, as well as undesirably high power consumption. The present teachings address the foregoing concerns.

BRIEF DESCRIPTION OF THE DRAWINGS

The present embodiments will now be described, by way of example, with reference to the accompanying drawings, in which.

DETAILED DESCRIPTION

Introduction

Means and methods related to memory resistors (memristors) are provided. A feedback controller applies adjustment signals to a memristor. A non-volatile electrical resistance of the memristor is sensed by the feedback controller during the adjustment. The memristor is adjusted to particular values lying between first and second limiting values with minimal overshoot. Increased memristor service life, faster operation, lower power consumption, and higher operational integrity are achieved by the present teachings.

In one embodiment, an apparatus includes a memristor characterized by a non-volatile electrical resistance. The apparatus also includes a feedback controller. The feedback controller is configured to adjust the non-volatile electrical resistance to one or more particular values between a first limiting value and a second limiting value. The feedback controller is electrically coupled to the memristor in a closed-loop control arrangement at least during the adjustment of the non-volatile electrical resistance.

In another embodiment, a method includes operating an electronic device including a memristor. The memristor is characterized by a non-volatile electrical resistance of a first value. The method also includes adjusting the non-volatile electrical resistance of the memristor from the first value to a second value different than the first value using a feedback controller. The method additionally includes operating the electronic device with the memristor characterized by the non-volatile electrical resistance of the second value.

First Illustrative Device

Figure 1:
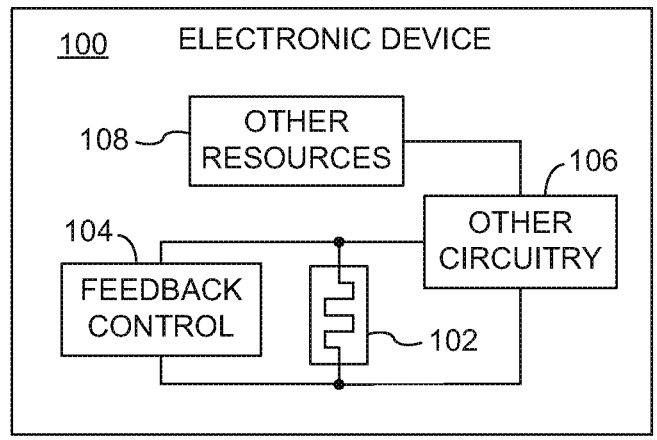
FIG. 1 depicts block diagram of an electronic device according to one embodiment.

Reference is now directed to FIG. 1, which depicts a block diagram of an electronic device 100. The device 100 is illustrative and non-limiting with respect to the present teachings. Thus, other devices can be configured, constructed or operated in accordance with the present teachings. For purposes of non-limiting illustration, it is assumed that the device 100 represents a memory or logic device. Any number of different types and embodiments of devices 100 inclusive of the present teachings are contemplated.

The device 100 includes a memory resistor, or memristor, 102. The memristor 102 can be defined by any suitable memristor used during normal operations of the device 100. For purposes of non-limiting illustration, it is assumed that the memristor 102 serves a value storage function by virtue of its ability to be selectively switched (or programmed) between non-volatile electrical resistance values. For further purposes of illustration, it is assumed that the memristor 102 is characterized by a minimum (on, or low state) electrical resistance of one-thousand Ohms and a maximum (off, or high state) electrical resistance of six-thousand Ohms.

The device 100 also includes a feedback controller (controller) 104. The controller 104 can be defined by any such controller contemplated by the present teachings. The controller 104 is configured to adjust the non-volatile electrical resistance of the memristor 102 by application of corresponding electrical signals. The controller 104 is electrically coupled to the memristor 102, at least during resistance adjustment (i.e., programming) operations. Appropriate switching (not shown) can be used to couple and de-couple the memristor 102 from the feedback controller 104 as needed.

The electronic device 100 also includes other circuitry 106. The other circuitry can be defined by or include any electronic circuitry configured to perform various normal operations of the device 100. Such other circuitry 106 can thus includes one or more processors, analog circuitry, digital circuitry, hybrid devices, a state machine, etc. The other circuitry 106 is electrically coupled to and configured to use the memristor 102 during normal operations.

The electronic device 100 further includes other resources 108. The other resources 108 can be defined by or include any suitable elements or device used during normal operations of the device 100. Non-limiting examples of such other resources 108 include a battery or batteries, a power supply, a user interface, wireless communications circuitry, network communications circuitry, a microprocessor or microcontroller, etc. The other resources are coupled to the other circuitry 106 as needed in order for the device 100 to perform its normal operations.

The device 100 is depicted as including a single memristor 102 in the interest of understanding. However, it is to be understood that any number of memristors 102 can be included within devices contemplated by the present teachings (e.g., such as a storage array of memristors, etc.). Additionally, individual addressing, and adjustment of those numerous memristors by way of feedback control, is contemplated by the present teachings. It is to be further noted that such memristors (memristor 102 or others) can be implemented at the integrated circuit (chip) level, integrated within complementary metal-oxide semiconductor (CMOS) circuitry. Other embodiments can also be defined and used.

First Illustrative Method

Figure 2:
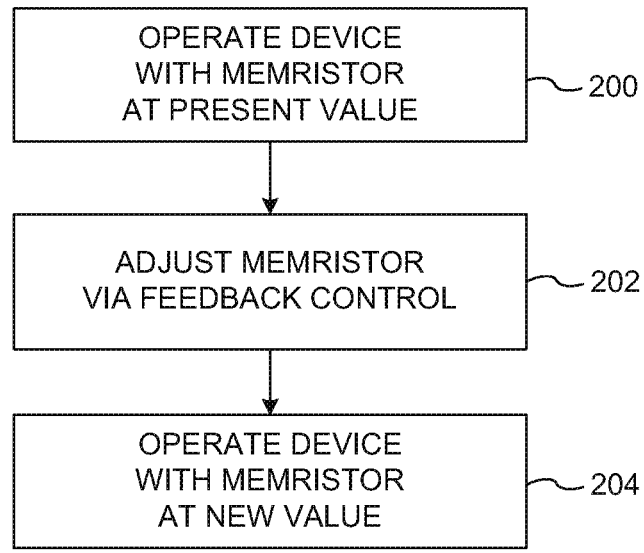
FIG. 2 depicts a flow diagram of a method according to one embodiment.

Attention is now directed to FIG. 2, which depicts a method according to one embodiment of the present teachings. The method of FIG. 2 depicts particular method steps and an order of execution. However, it is to be understood that other methods including other steps, omitting one or more of the depicted steps, or proceeding in other orders of execution are also contemplated. Thus, the method of FIG. 2 is illustrative and non-limiting with respect to the present teachings. Reference is made to FIG. 1 in the interest of understanding the method of FIG. 2.

At 200, an electronic device operates normally with a memristor at a present electrical resistance value. The present resistance value is also referred to as a first value for purposes of discussion. For purposes of non-limiting illustration, it is assumed that the electronic device 100 operates normally with the memristor 102 characterized by a non-volatile resistance value of two-thousand Ohms.

At 202, the non-volatile resistance of the memristor is adjusted using feedback control. For purposes of the ongoing illustration, it is assumed that the feedback controller 104 applies electrical signaling to the memristor 102 so as to cause the non-volatile electrical resistance to be shifted toward another value. The feedback controller 104 monitors (senses) the instantaneous electrical resistance of the memristor 102 during the adjustment process. The controller 104 stops the adjustment process just as the memristor 102 reaches the desired resistance. For non-limiting example, the memristor 102 now exhibits four-thousand Ohms of non-volatile resistance.

At 204, the electronic device is operated normally with the memristor at the new electrical resistance value. For purposes of the present illustration, it is assumed that the device 100 operates normally with the memristor 102 at four-thousand Ohms of resistance.

In general and without limitation, the present teachings contemplate various devices respectively includes of various number of memristors. Such devices also include one or more feedback controllers configured to selectively adjust (or program) the non-volatile electrical resistance of the memristors on an individually addressable basis. Feedback signaling is used to monitor the instantaneous resistance value of a particular memristor during the adjustment process. Multiplexing, de-multiplexing, switching and other means familiar to one of ordinary skill in the electronic arts can be used so as access and program particular memristors during resistance adjustment operations.

The feedback controller then ceases the applied adjustment stimulus as the memristor reaches or nears the desired resistance value so as to minimize or substantially eliminate overshoot. Furthermore, such adjustments can be made between selected electrical resistance values that lie well within the minimum-to-maximum range (i.e., low-to-high states) for the particular memristor. In this way, power consumption is reduced and memristor longevity is increased relative to programming techniques that operate strictly between minimum and maximum (i.e., "rail-to-rail") resistance values.

First Illustrative Controller

Figure 3:
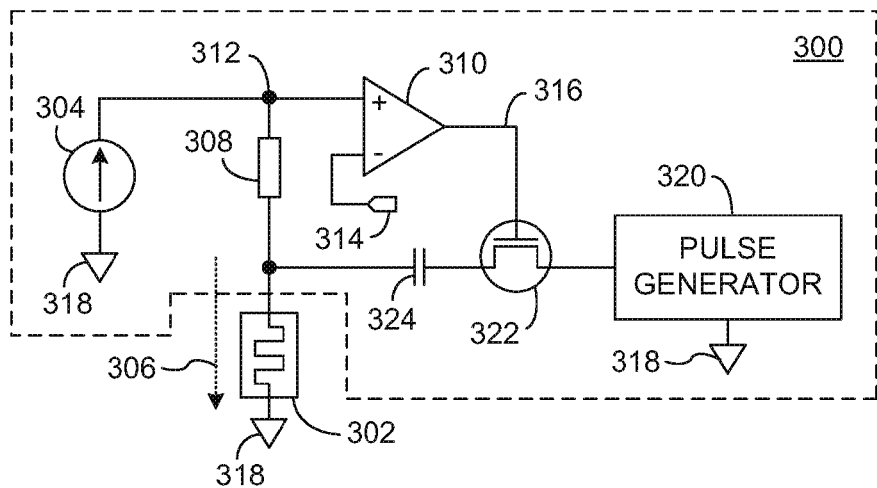
FIG. 3 depicts a schematic diagram of a feedback controller according to one embodiment.

Reference is now made to FIG. 3, which depicts a schematic diagram of a feedback controller (controller) 300 according to another embodiment of the present teachings. The controller 300 is illustrative and non-limiting in nature. Thus, other controllers are contemplated that include one or more aspects of the present teachings. The controller 300 is electrically coupled to an illustrative memristor 302 in the interest of understanding the present teachings. It is to be understood that the controller 300 can be electrically coupled and de-coupled from the memristor 302 as needed during resistance adjustment and normal operations, respectively.

The controller 300 includes a source of constant direct-current (DC) electrical energy (source) 304. The source 304 is configured to drive an electrical current 306 through memristor 302 by way of a resistor 308. The current 306 is of relatively low value and is selected to permit sensing the instantaneous resistance value of the memristor 302. In one embodiment, the current 306 is in the range of one-to-ten uA (microamperes), while the resistor 308 has a value of one-thousand Ohms. Other suitable respective values of current 306 and resistor 308 can also be used.

The controller 300 also includes a comparator 310. The comparator 310 is electrically coupled to a sensing node 312 and to a reference voltage at a node 314. Voltage present at the node 312 corresponds to the instantaneous resistance value of the memristor 302. The comparator is configured to provide an output signal at a node 316 in accordance with a comparison of the reference voltage at node 314 and the voltage at the sensing node 312. In this way, the output signal at node 316 corresponds to the difference (if any) between the instantaneous memristor 302 value and a desired value established at the reference voltage node 314. The comparator 310 output signal is also referred to as an error signal. It is noted that the reference voltage at node 314 can be of selectable magnitude or polarity (positive or negative) relative to ground node 318.

The controller 300 also includes a pulse generator 320. The pulse generator 320 is configured to provide pulses of DC electrical energy of controllable magnitude and frequency. The pulse generator 320 is coupled to apply electrical pulses to the memristor 302 by way of a transistor (i.e., switch) 322 and a coupling capacitor 324. It is noted that the pulse generator can provide pulses of selective polarity (positive or negative) relative to ground node 318.

The controller 300 also includes a transistor 322 as introduced above. The transistor 322 is coupled to the comparator 310 at output signal node 316, to the pulse generator 320 and to coupling capacitor 324. The transistor 322 is configured to operate as a switch under the controlling influence of the comparator 310. That is, electrical pulses from the pulse generator 320 are routed to the memristor 302 through the transistor 322 in accordance with the output signaling of the comparator 310.

It is to be understood that the controller 300 can be defined, in whole or in part, by selected discrete components. Additionally, the controller 300 can be defined, in whole or in part, by an application-specific integrated circuit (ASIC). In yet another embodiment, the controller 300 can be defined, in whole or in part, by a microcontroller operating in accordance with a computer-readable program code. One having ordinary skill in the electrical engineering arts will appreciate that the controller 300 can be constructed using various circuit elements, and an exhaustive recitation is not needed for purposes of understanding the present teachings.

In one embodiment, the controller 300 includes, or is defined by, read/write circuitry configured to store values in and retrieve values from the memristor 302. In such an illustrative and non-limiting embodiment, the memristor 302 is used as a memory cell or storage element. Vast memory arrays inclusive of numerous memristors (e.g., 302, etc.) can be defined and operated using feedback control according to the present teachings.

In another embodiment (not shown), a feedback controller is provided that includes two respective reference voltage nodes, and two distinct pulse generators. These respective "mirror image" circuit portions are configured to controllably provide pulses of opposite polarities to a memristor. That is, one portion causes increases in memristor resistance value, while the other causes decreases in memristor resistance value. Such controller circuit portions are coupled to the memristor by way of suitable multiplexing circuitry.

Figure 4:
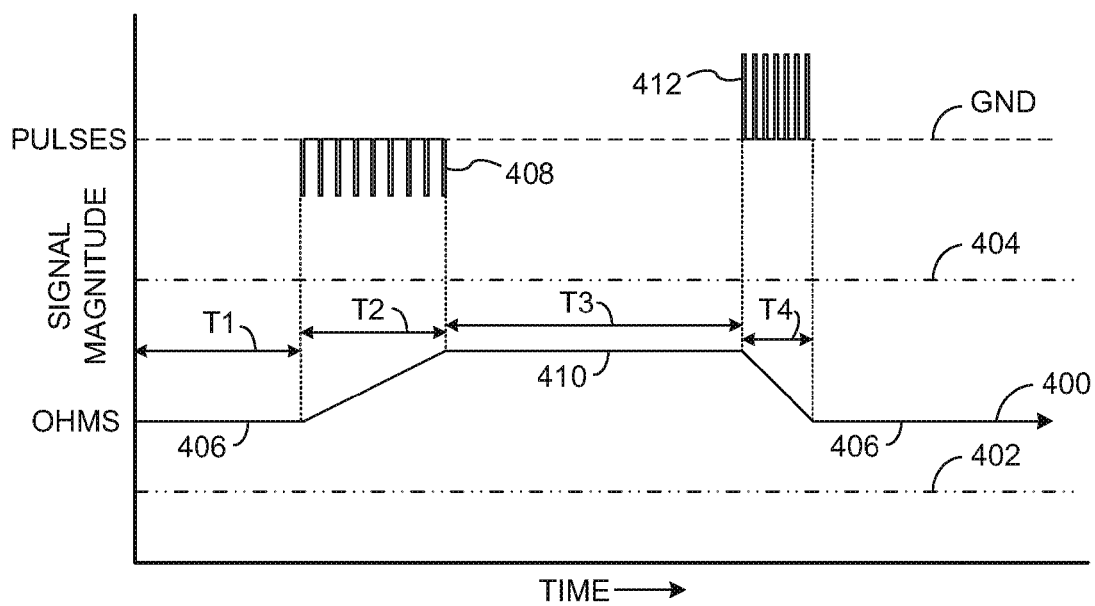
FIG. 4 depicts a signal timing diagram corresponding to the embodiment of FIG. 3.

FIG. 4 is a signal timing diagram depicting illustrative and non-limiting operations of the controller 300. As depicted, the memristor 302 is defined by an instantaneous, non-volatile electrical resistance 400 that is adjusted over time. The memristor 302 is further characterized by a minimum (on, or low state) electrical resistance 402, and a maximum (off, or high state) electrical resistance 404. The minimum and maximum electrical resistances 402 and 404 (respectively) are also referred to as "limiting resistances" for the memristor 302.

The resistance values 402 and 404 represent lower and upper limits, respectively, for the electrical resistance achievable by the memristor 302. These values 402 and 404 are also referred to as rail-to-rail resistances for the memristor 302. For purposes of non-limiting example, it assumed that the minimum resistance 402 is one-thousand Ohms, and that the maximum resistance 404 is four-thousand Ohms. The memristor 302 operates with the electrical resistance 400 at a first value 406 during time period T1. For purposes of non-limiting example, it is assumed that the first value 406 is two-thousand Ohms.

Then, during time period T2, a series of electrical pulses (i.e., control, or programming signals) 408 are applied to the memristor 302 by way of controller 300. It is noted that the pulses 408 are characterized by a particular polarity relative to ground, magnitude and frequency. In turn, the electrical resistance 400 of the memristor 302 transitions (increases) during time period T2 from the first value 406 to a second, greater value 410. For purposes of non-limiting example, it is assumed that the second value 410 is three-thousand Ohms.

During the next time period T3, no electrical pulses are applied to the memristor 302. The memristor 302 maintains the non-volatile electrical resistance 400 at the second value 410 throughout the time period T3. Normal operations of other circuitry coupled to (or inclusive of) the memristor 302 can be performed during time period T3.

During the next time period T4, a series of electrical pulses 412 is applied to the memristor 302 by way of controller 300. It is noted that the pulses 412 are characterized by polarity, magnitude and frequency parameters that are different than those of the pulses 408. Specifically, the pulses 412 are of opposite polarity, and of greater frequency and magnitude, relative to the pulses 408.

In turn, the electrical resistance 400 of the memristor 302 transitions (decreases) during time period T4 from the second value 410 back to the first value 406. It is noted that the magnitude and frequency of the pulses 412 cause the electrical resistance 400 to shift between values 410 and 406 in less time during period T4 than during period T2. That is, the magnitude or frequency (or both) of the electrical pulses applied by the controller 300 can be respectively controlled so as to affect the time-rate-of-change of the electrical resistance 400. Furthermore, the polarity of the electrical pulses determines the direction of the resistance 400 shift—increasing or decreasing, respectively.

Second Illustrative Controller

Figure 5:
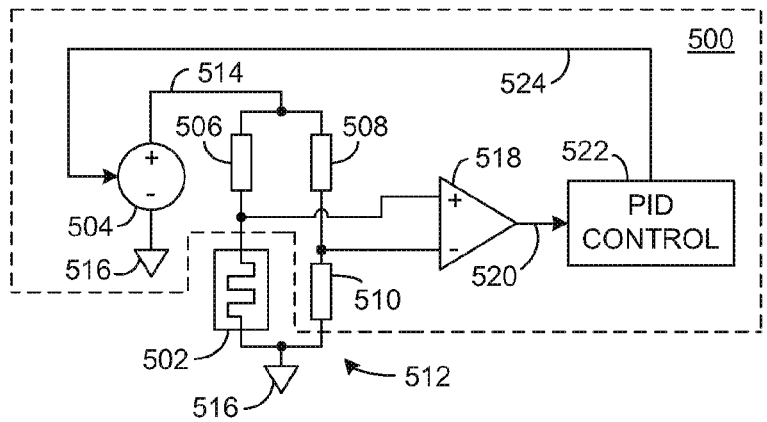
FIG. 5 depicts a schematic diagram of a feedback controller according to another embodiment.

Reference is now made to FIG. 5, which depicts a schematic diagram of a feedback controller (controller) 500 according to another embodiment of the present teachings. The controller 500 is illustrative and non-limiting in nature. Thus, other controllers are contemplated that include one or more aspects of the present teachings. The controller 500 is electrically coupled to an illustrative memristor 502 in the interest of understanding the present teachings. It is to be understood that the controller 500 can be electrically coupled and de-coupled from the memristor 502 as needed during resistance adjustment and normal operations, respectively.

The controller 500 includes a controllable source of direct-current (DC) electrical voltage (source) 504. The source 504 is configured to provide an electrical potential that is controllable by way of the controller 500 as described hereinafter. As such, the polarity or magnitude (or both) of the source 504 can be controllably adjusted with respect to time.

The controller 500 also includes a plurality of resistors 506, 508 and 510, respectively. The resistors 506-510, inclusive, are of an equal electrical resistance value "R" Ohms. The resistors 506-510 and the memristor 502 are electrically coupled to define a Wheatstone Bridge 512. The Wheatstone Bridge 512 is electrically coupled to the source 504 by way of a node 514, and to electrical ground potential at a node 516.

In another embodiment, the memristor 502 is electrically coupled as an element of the Wheatstone Bridge 512 during resistance adjustment operations, and is electrically isolated there from at other times. One of skill in the electrical arts can appreciate that such selective coupling to the memristor 502 can be performed by way of switches, relays, transistors or other suitable elements.

The controller 500 also includes a comparator 518. The comparator 518 is electrically coupled across the Wheatstone Bridge 512. The comparator 518 is configured to provide an output signal at a node 520 in accordance with the balance condition of the Wheatstone Bridge 512. Specifically, when the electrical resistance value of the memristor 502 is equal to that of the other resistors 506-510—that is, "R" Ohms—the bridge is "balanced" and the comparator 518 senses zero volts differential across the Wheatstone Bridge 512.

Conversely, when the memristor 502 resistance value is other than "R" Ohms, the bridge is "out-of-balance" and the comparator 518 senses a corresponding (non-zero) electrical voltage across the Wheatstone Bridge 512. The magnitude of the sensed voltage corresponds to the difference between "R" Ohms and the memristor 502 resistance value. In turn, the polarity of the sensed voltage corresponds to whether the memristor 502 resistance value is greater than or less than "R".

In this way, the output signal at node 520 corresponds to the difference (if any) between the instantaneous memristor 502 value and the value "R" Ohms as defined by the resistors 506-510. The comparator 518 output signal is also referred to as an error signal. It is noted that one or more desired (and programmable) memristor 502 resistance values correspond to respective out-of-balance conditions for the Wheatstone Bridge 512. Thus, the controller 500 can operate to establish and maintain such a desired out-of-balance condition during normal operations.

The controller 500 further includes a proportional-integral-derivative (RID) controller 522. The RID controller 522 is configured to receive the comparator 518 output (i.e., error) signal at node 520 and to provide a control signal output at a node 524. The signal at node 524 is coupled to the source 504 so as to control the polarity and time-varying magnitude of the voltage applied to the Wheatstone Bridge 512. The PID controller 522 is further configured to control the source 504 in accordance with proportional-integral-derivative control action. It is important to note that some particular out-of-balance condition can correspond to a desired resistance value for the memristor 502, and that such an out-of-balance condition can define a "setpoint" for the PID controller 522.

The PID controller 522 can implemented by way of dedicated-purpose integrated circuitry, a microcontroller operating in accordance with executable program code, etc. One having ordinary skill in the control arts is familiar with PID control action, and further elaboration is not needed for an understanding of the present teachings.

It is to be understood that the controller 500 can be defined, in whole or in part, by selected discrete components. Additionally, the controller 500 can be defined, in whole or in part, by an application-specific integrated circuit (ASIC). In another embodiment, the controller 500 can be defined, in whole or in part, by a microcontroller operating in accordance with a computer readable program code. One having ordinary skill in the electrical engineering arts will appreciate that the controller 500 can be constructed using various circuit elements, and an exhaustive recitation is not needed for purposes of understanding the present teachings.

In one embodiment, the controller 500 includes, or is defined by, read/write circuitry configured to store values in and retrieve values from the memristor 502. In such an illustrative and non-limiting embodiment, the memristor 502 is used as a memory cell or storage element. Memory arrays can be defined and operated using the PID feedback control contemplated by the present teachings.

In another embodiment (not shown), a feedback controller is provided that includes one or more adjustable or selectable resistance values within a Wheatstone Bridge (e.g., 512). In such an embodiment, the memristor can be adjusted to some particular resistance value (within the limiting values) by altering one or more resistor values (i.e., "R1") of the bridge. The memristor is then reprogrammed under PID control until a balanced bridge condition is detected.

Figure 6:
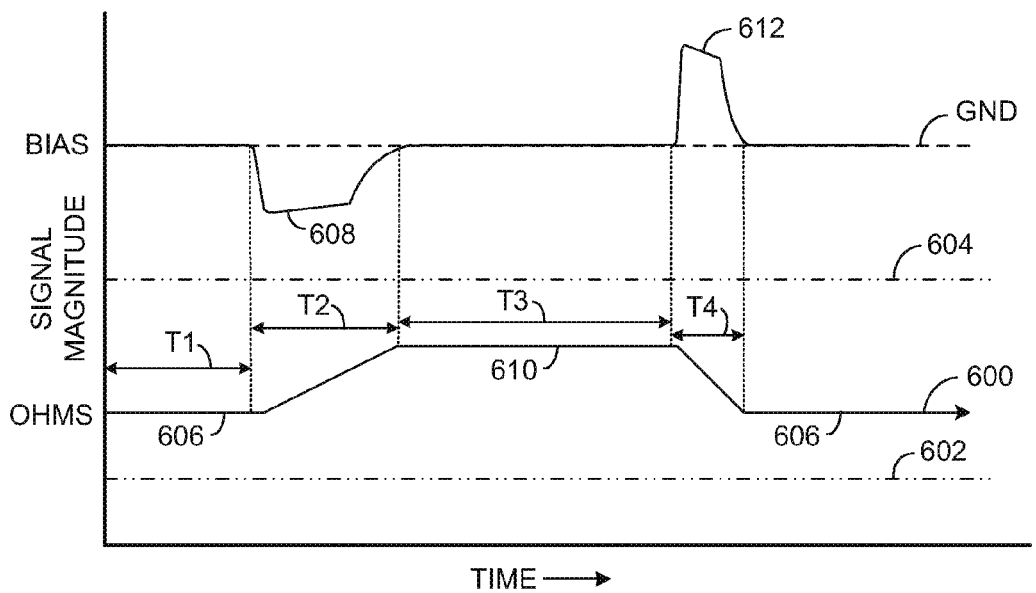
FIG. 6 depicts a signal timing diagram corresponding to the embodiment of FIG. 5.

FIG. 6 is a signal timing diagram depicting illustrative and non-limiting operations of the controller 500. As depicted, the memristor 502 is defined by an instantaneous, non-volatile electrical resistance 600 that is adjusted over time. The memristor 502 is further characterized by a minimum (on, or low state) electrical resistance 602, and a maximum (off, or high state) electrical resistance 604.

The resistance values 602 and 604 represent lower and upper limits, respectively, for the electrical resistance achievable by the memristor 502, and are referred to as limiting values. These values 602 and 604 are also referred to as rail-to-rail resistances for the memristor 502. For purposes of non-limiting example, it assumed that the minimum resistance 602 is two-thousand Ohms, and that the maximum resistance 604 is six-thousand Ohms. The memristor 502 operates with the electrical resistance 600 of a first value 606 during time period T1. For purposes of non-limiting example, it is assumed that the first value 606 is three-thousand Ohms.

Then, during time period T2, an electrical bias voltage (i.e., programming signal) 608 is applied to the Wheatstone Bridge 512 by the controller 500. This bias voltage 608 is applied so as to affect a change in the non-volatile electrical resistance of the memristor 502. It is noted that the bias voltage 608 is characterized by a particular polarity and a time-varying magnitude in accordance with PID control action. In turn, the electrical resistance 600 of the memristor 502 transitions (increases) during time period T2 from the first value 606 to a second, greater value 610. For purposes of non-limiting example, it is assumed that the second resistance value 610 is four-thousand Ohms.

During the next time period T3, no bias voltage is applied to the Wheatstone Bridge 512. As such, the memristor 502 exhibits the non-volatile electrical resistance 600 at the second value 610 throughout the time period T3.

Thereafter, during time period T4, a bias voltage 612 is applied to the Wheatstone Bridge 512 by way of controller 500. It is noted that the bias voltage 612 is characterized by a polarity and time-varying magnitude that differ from that of the bias voltage 608. Specifically, the bias voltage 612 is of opposite polarity and of greater peak magnitude relative to the bias voltage 608.

In turn, the electrical resistance 600 of the memristor 502 transitions (decreases) during time period T4 from the second value 610 back to the first value 606. It is noted that the time-varying magnitude and the polarity of the bias voltage can be controlled, via PID action, so as to drive the electrical resistance of the memristor 502 between values 610 and 606 is less time than during time period 12. It is further noted that the PID controller 522 continuously senses the balance condition of the Wheatstone Bridge 512—and thus, the instantaneous resistance of the memristor 502—by way of the error signal at node 520.

The controller 500 is configured to monitor a balanced or out-of balance condition of the Wheatstone Bridge 512 in accordance with the presently desired resistance value for the memristor 502. That is, particular voltages sensed across the Wheatstone Bridge 512 are correlated to particular memristor 502 resistance values. Thus, the PID controller 522 is configured to control the source 504 so as to adjust the memristor 502 from a first resistance value (e.g., 606, etc.) to a second resistance value (e.g., 610, etc.) in a predetermined time period and with minimal or no overshoot.

Resistances that lie within the range defined by the rail-to-rail values 602 and 604 can be programmed into the memristor 502 so as to maximize the useful life of the memristor 502. The time periods used during adjustment (e.g., T2 and T4, etc.) can also be controlled by the PID controller 522 in the interest of memristor 502 endurance.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended dams, along with the full scope of equivalents to which such cams are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
   a memristor characterized by a non-volatile electrical resistance;
   a feedback controller configured to adjust the non-volatile electrical resistance to one or more particular values between a first limiting value and a second limiting value, the feedback controller electrically coupled to the memristor in a closed-loop control arrangement at least during the adjustment of the non-volatile electrical resistance;
   wherein the feedback controller is further configured to monitor an instantaneous electrical resistance of the memristor during adjustment of the non-volatile electrical resistance to either the first or second limiting value and to stop the adjustment based on the instantaneous electrical resistance reaching a desired resistance at either said first or second limiting value;
   the feedback controller further configured to adjust the non-volatile electrical resistance of the memristor by way of proportional-integral-derivative control.

2. The apparatus according to claim 1, wherein the feedback controller comprise:
   a number of resistors forming a partial balancing bridge, the memristor being connected into the balancing bridge, at least during adjustment of the non-volatile electrical resistance of the memristor, to complete the balancing bridge;

a comparator connected across the balancing bridge to output a signal indicating whether the bridge is balanced; and a proportional-integral-derivative control connected to receive the signal output by the comparator and control a signal applied to the balancing bridge.

3. The apparatus according to claim 1, the feedback controller further configured to adjust the non-volatile electrical resistance of the memristor by way of a variable direct-current bias voltage.

4. The apparatus according to claim 1, the feedback controller further comprising a proportional-integral-derivative control configured to receive a signal indicative of the instantaneous electrical resistance of the memristor and to control a voltage applied to the memristor in response.

5. The apparatus according to claim 1, the feedback controller further comprising a proportional-integral-derivative control to control and vary a duration, polarity and amplitude of a direct-current bias voltage applied to adjust the non-volatile resistance of the memristor in response to the instantaneous electrical resistance of the memristor during the adjustment of the non-volatile electrical resistance.

6. The apparatus according to claim 1, the memristor being an element of a Wheatstone Bridge at least during the adjustment of the non-volatile electrical resistance.

7. The apparatus according to claim 6, the feedback controller including a comparator electrically coupled across the Wheatstone Bridge, at least during the adjustment of the non-volatile electrical resistance, wherein, when the Bridge is electrically balanced, the feedback controller discontinues a direct-current bias that is adjusting the non-volatile electrical resistance of the memristor.

8. The apparatus of claim 1, wherein the feedback controller is selectively decoupled from the memristor after adjustment of the non-volatile electrical resistance.

9. The apparatus of claim 8, further comprising a multiplexer to selectively connect the feedback controller to any of a plurality of memristors in an array of memristors for adjustment of non-volatile electrical resistance of that memristor.

10. An apparatus, comprising:

a memristor characterized by a non-volatile electrical resistance;

a feedback controller configured to adjust the non-volatile electrical resistance to one or more particular values between a first limiting value and a second limiting value, the feedback controller electrically coupled to the memristor in a closed-loop control arrangement at least during the adjustment of the non-volatile electrical resistance, the feedback controller further configured to adjust the non-volatile electrical resistance of the memristor by way of electrical pulses; and a pulse generator connected to apply a series of multiple pulses to said memristor to adjust the non-volatile electrical resistance to either the first or second limiting value;

a switch for selectively connecting the pulse generator to the memristor, wherein a comparator controls the switch based on an instantaneous electrical resistance of the memristor.

11. The apparatus according to claim 10, the feedback controller further configured to control at least the frequency of the electrical pulses, the amplitude of the electrical pulses, or the polarity of the electrical pulses.

12. The apparatus according to claim 10, the feedback controller further configured to apply a sensing current to the memristor at least during the adjustment of the non-volatile electrical resistance.

13. The apparatus of claim 10, wherein the switch comprises a transistor gated by the comparator and a coupling capacitor connected between the transistor and the memristor.

14. The apparatus of claim 10, wherein the pulse generator comprises two separate pulse generators for outputting pulses of opposite polarity, each pulse generator being selectively connected to the memristor by the feedback controller to adjust the memristor's electrical resistance.

15. The apparatus of claim 10, wherein the feedback controller is selectively decoupled from the memristor after adjustment of the non-volatile electrical resistance.

16. A method, comprising:

operating an electronic device including an array of memristors comprising a first memristor characterized by a non-volatile electrical resistance of a first value;

selectively coupling a feedback controller to the first memristor;

adjusting the non-volatile electrical resistance of the first memristor from the first value to a second value different than the first value using the feedback controller;

with the feedback controller, monitoring an instantaneous electrical resistance of the memristor during adjustment of the non-volatile electrical resistance to the second value and stopping the adjusting of the non-volatile electrical resistance based on the instantaneous electrical resistance reaching the second value;

operating the electronic device with the memristor characterized by the non-volatile electrical resistance of the second value; and decoupling the feedback controller from the first memristor and selectively coupling the feedback controller to a second memristor in the array to adjust a non-volatile resistance of that second memristor.

17. The method according to claim 16, the adjusting the non-volatile electrical resistance of the memristor performed by way of a series of multiple electrical pulses controlled by the feedback controller that adjust the non-volatile electrical resistance from the first to the second value.

18. The method according to claim 16, the adjusting the non-volatile electrical resistance of the memristor performed by way of proportional-integral-derivative action of the feedback controller.

19. The method according to claim 16 further comprising monitoring a balance condition of a Wheatstone Bridge during the adjusting of the non-volatile electrical resistance of the memristor;

wherein when the Bridge is electrically balanced, the feedback controller discontinues a direct-current bias that is adjusting the non-volatile electrical resistance of the memristor.

20. The method according to claim 16, the adjusting of the non-volatile electrical resistance of the memristor performed by way of adjustment signals, the feedback controller configured to control at least an amplitude of the adjustment signals, a polarity of the adjustment signals, or a frequency of the adjustment signals.

* * * * *